(12) United States Patent
Matsuda et al.

(10) Patent No.: US 6,328,169 B1
(45) Date of Patent: Dec. 11, 2001

(54) FRAME STRUCTURE FOR HOUSING PANEL PLATES

(75) Inventors: Tamotsu Matsuda, Yokohama; Hitoshi Takano, Sagamihara, both of (JP)

(73) Assignee: Nikko Kogyo Kabushiki Kaisha, Yokohama (JP)

( * ) Notice: Subject to any disclaimer, the term of this patent is extended or adjusted under 35 U.S.C. 154(b) by 0 days.

(21) Appl. No.: 09/669,857

(22) Filed: Sep. 27, 2000

(30) Foreign Application Priority Data

Jun. 12, 2000 (JP) .................................................. 12-175737

(51) Int. Cl.[7] ....................................................... A47F 5/00
(52) U.S. Cl. ........................ 211/41.17; 211/175; 361/758; 361/752
(58) Field of Search .......................... 211/175, 26, 41.17; 361/756, 758, 752

(56) References Cited

U.S. PATENT DOCUMENTS

| | | | |
|---|---|---|---|
| 4,099,623 | * 7/1978 | Van Osdol | 211/41.17 |
| 4,385,781 | * 5/1983 | Welsch et al. | 211/41.17 X |
| 4,563,722 | * 1/1986 | Maroney et al. | 211/41.17 X |
| 4,600,231 | * 7/1986 | Sickles | 211/41.17 X |
| 4,746,015 | * 5/1988 | Kaucic . | |
| 4,761,044 | 8/1988 | Akama et al. . | |
| 5,168,431 | * 12/1992 | Moulton et al. | 211/41.17 X |
| 5,593,046 | * 1/1997 | Katsuura et al. | 211/41.17 |
| 5,660,122 | * 8/1997 | Sickles et al. . | |
| 6,098,808 | * 8/2000 | Matsuda et al. . | |

* cited by examiner

*Primary Examiner*—Robert W. Gibson, Jr.
(74) *Attorney, Agent, or Firm*—Oblon, Spivak, McClelland, Maier & Neustadt, P.C.

(57) ABSTRACT

A frame structure includes a pair of side frame boards, with the inner surfaces of the side frame boards that face each other being provided with a plurality of support grooves for receiving panel plates. The frame structure has a device for adjusting the spacing between the side frame boards. The adjustment device is a projection provided on at least one of the inner surfaces of the side frame boards that face each other, the size of the projection being such that the spacing is set to an amount that is the width of the received panel plates plus a clearance.

4 Claims, 10 Drawing Sheets

FRAME STRUCTURE FOR HOUSING PANEL PLATES

CROSS-REFERENCE TO RELATED APPLICATIONS

This application is related to and claims priority, under 35 U.S.C. § 119, from Japanese Patent Application No. 2000-175737, filed on Jun. 12, 2000, the entire contents of which are hereby incorporated by reference herein.

BACKGROUND OF THE INVENTION

1. Field of the Invention

The present invention generally relates to a frame structure for housing panel plates, such as printed circuit boards used in electrical and electronic devices, as well as panel plates for use in other industrial fields, such as panels used as construction materials. More particularly, the present invention relates to a frame structure that is capable of readily accommodating variations in the width dimension of the panel plates to be housed.

2. Discussion of Background

A prior art frame structure will now be described with reference to FIG. 10. The frame structure shown in the drawing comprises a top plate 91 that is spaced from a bottom plate 92. The top plate 91 is fixed to the bottom plate 92 by four support columns 93. The frame structure also has an immovable side frame board 94 that is erected on either the right or left side, and a movable side frame board 95 that is erected on the other side and can be moved horizontally toward the immovable side frame board 94. In order to secure the movable side frame board 95 at a desired position, sliding frames 98 are disposed between the top plate 91 and the bottom plate 92. The top and bottom plates are each provided with a pair of parallel slots 96 through which are inserted the fastening ends of fastening members 97, such as hexagon-headed bolts or screws, protruded upwardly and downwardly from the sliding frames 98 on the outer side of the movable side frame board 95, that can fasten the frames 98 by mating members 99 such as a nut or the like. The inner faces of the side frame boards 94 and 95 are provided with a plurality of horizontally extending lateral support grooves 100. Each of a plurality of panel plates 101 can be individually supported in a horizontal position between the side frame boards 94 and 95 by the lateral grooves 100.

The distance between the two side frame boards is adjusted in accordance with the width of the panel plates to be housed. Since if the board distance is the same as the width of the panel plates that are housed, it becomes difficult to smoothly insert or remove a plate, it is necessary to house the plates with a slight clearance. However, setting this clearance requires fine adjustment of the distance between the side frame boards 94 and 95, which is time-consuming. Moreover, it is not easy to always set the same clearance.

An object of the present invention is therefore to provide a frame structure that does not have the above-described drawbacks, in which a distance between the side frame boards that includes a predetermined clearance can be set with high speed and high precision.

SUMMARY OF THE INVENTION

To attain this object, the present invention provides a frame structure that comprises: a pair of side frame boards, inner surfaces of the side frame boards that face each other being provided with a plurality of support grooves for receiving panel plates; means of adjusting spacing between the side frame boards; and an adjustment projection on at least one of the inner surfaces of the side frame boards that face each other, said projection being for setting said spacing to an amount that is a width of received panel plates plus a predetermined clearance.

Thus, on at least one of the inner surfaces of the side frame boards that face each other, there is formed a slight spacing adjustment projection to provide a clearance. A received panel plate is placed in contact with the projection to set the distance between the pair of side frame boards. This makes it possible to readily and precisely set the spacing to include an appropriate clearance for facilitating insertion and removal of panel plates.

Since the frame structure is also provided with means of effecting parallel movement of one of the side frame boards towards the other side frame board, the clearance adjustment projection only has to be provided at one point on the side frame board, enabling adjustment of the spacing to be implemented quickly and easily.

Further features of the invention, its nature and various advantages will be more apparent from the accompanying drawings and following detailed description of the invention.

DESCRIPTION OF THE PREFERRED EMBODIMENTS

Figure 1:
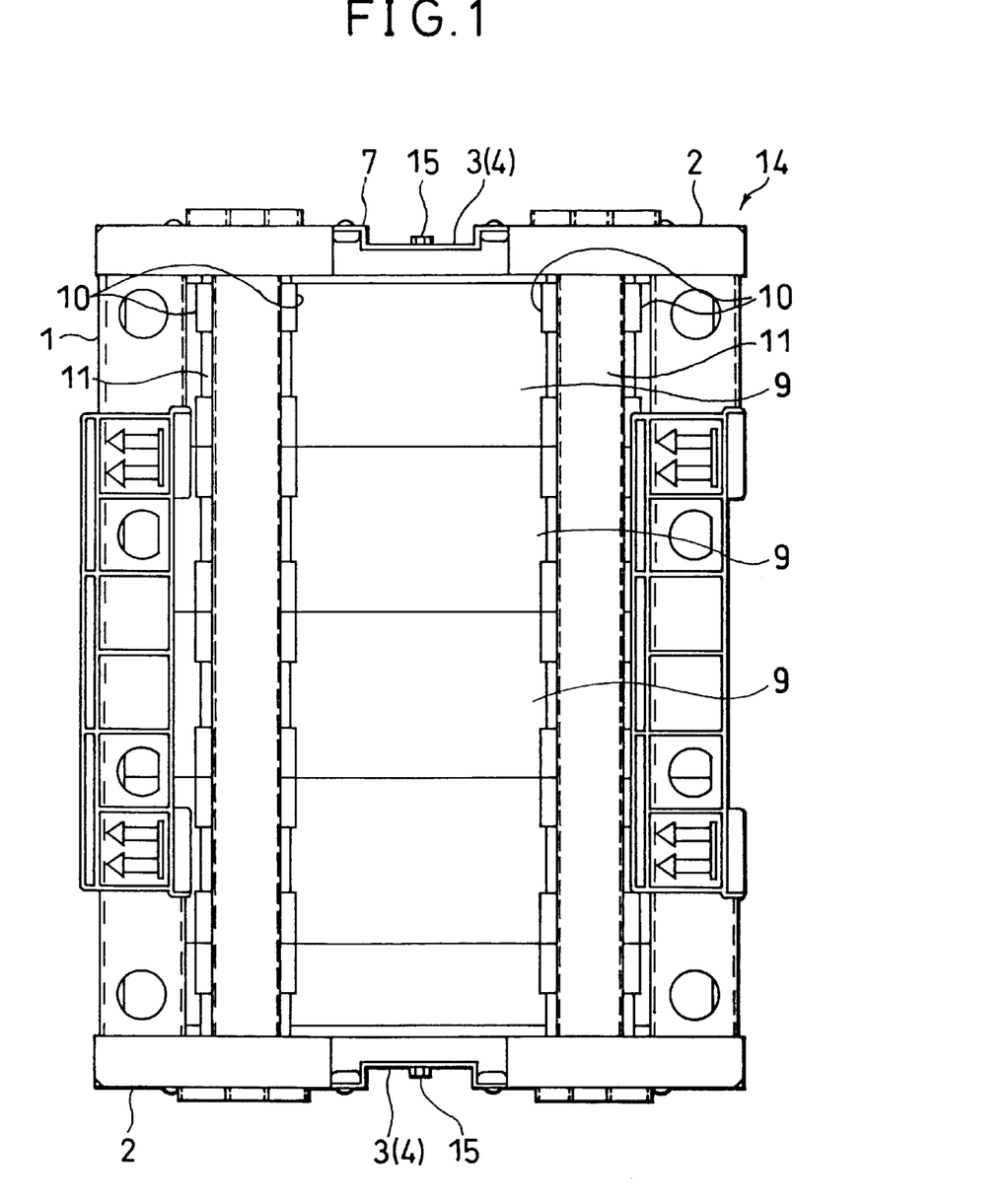
FIG. 1 is a front view of a frame structure according to one embodiment of the present invention.
Figure 2:
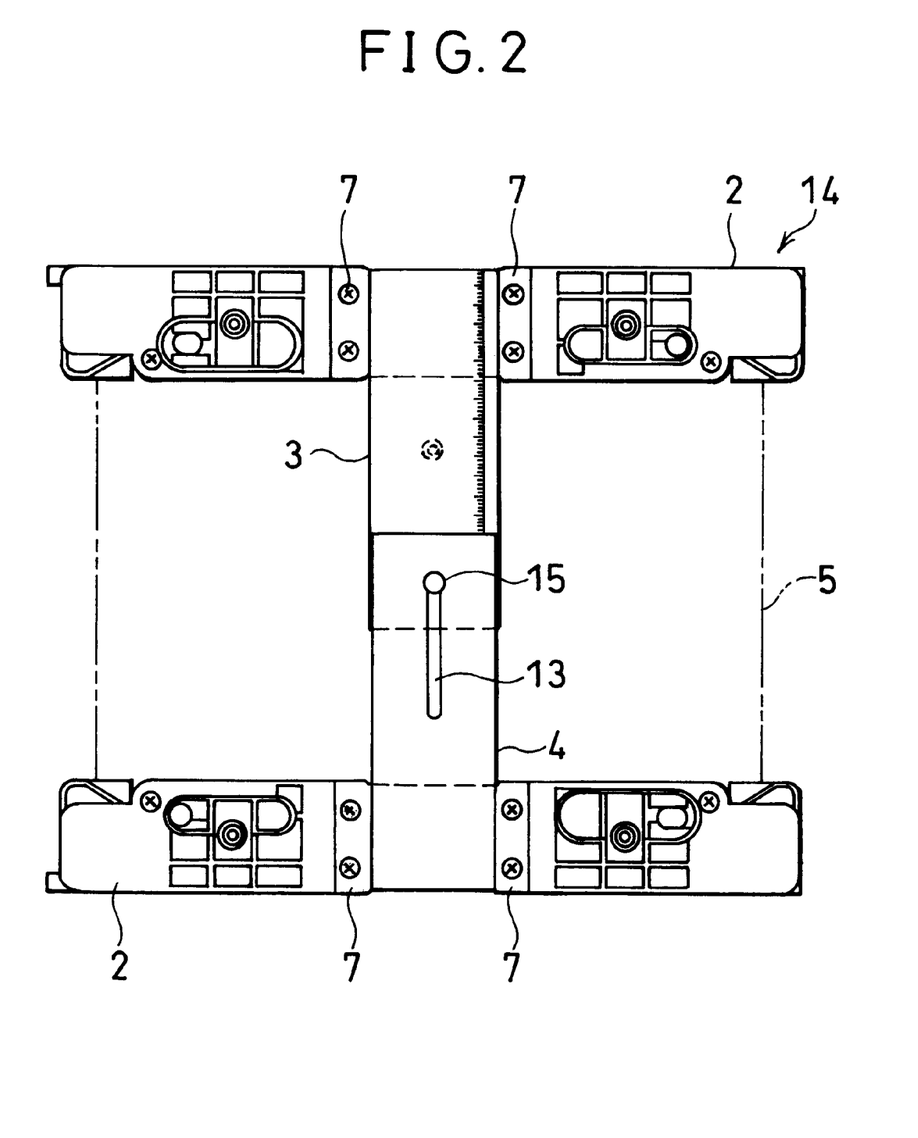
FIG. 2 is a plan view of the frame structure of FIG. 1.
Figure 3:
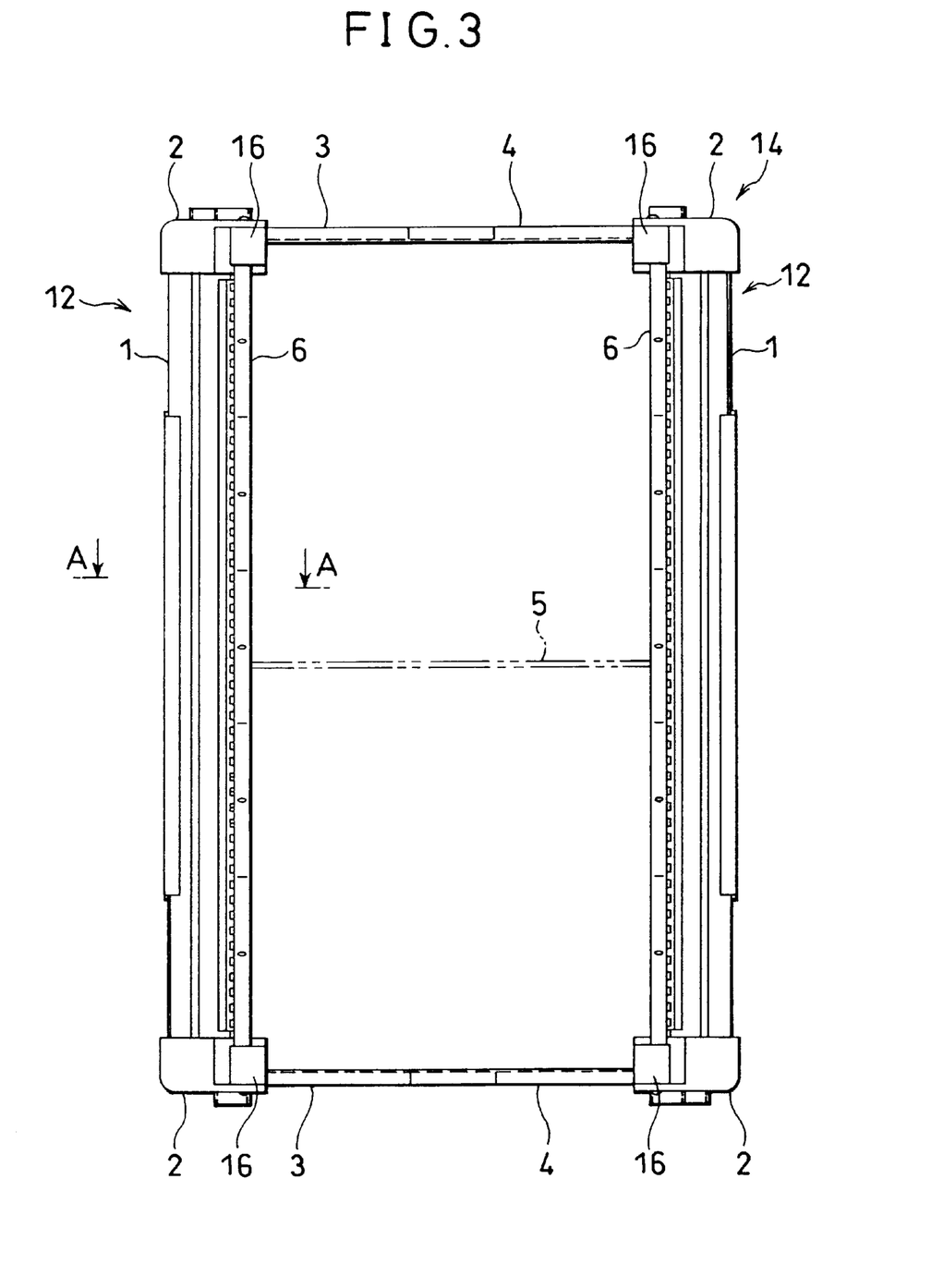
FIG. 3 is a side view of the frame structure of FIG. 1.

FIGS. 1 to 3 show a frame structure according to a first embodiment of the present invention. The frame structure 14 comprises a pair of opposed side frame boards 1, a pair of bases 2 affixed to the upper ends and lower ends of the pair of side boards 1, and a pair of connecting plates 3 and 4 that connect the facing sides of the pair of bases 2, forming a box-like structure with openings at opposite ends through which panel plates 5 can be housed. To prevent the panel plate 5 thus housed from falling out of the frame structure, a stop member 6 is provided in the vicinity of the opening at each end thereof. Each of the stop members 6 is supported on the upper and lower bases 2 by a hinge member 16.

Each of the pair of opposed side frame boards 1 in this embodiment is composed of a plurality of small unit plates 9, each of which has parallel support grooves 8 formed on its inner surface to receive the panel plates 5. Each of the unit plates 9 is provided with a pair of hooks 10 positioned slightly inboard of each edge portion on its outer surface, such as to face each other across their openings. A plurality of such unit plates 9 are stacked vertically and the web of a hat form 11 is inserted into the space defined by the vertically aligned pairs of hooks 10 on each side, forming a unitary side frame board. The end of each hat form 11 is fitted into a groove provided in the base 2 and is bolted in place, affixing the side frame boards 1 to the base 2 to form a unitary board 12.

As shown in the plan view of FIG. 2, the bases 2 at both ends of one side frame board 1 are affixed to one end of the connecting plate 3 by means of anchor portions 7, and the bases of the other side frame board 1 are similarly affixed to one end of the connecting plate 4. The other end of the connecting plate 3 has a bolt 15 affixed thereto. The other end of the connecting plate 4 has a slot 13 through which the bolt 15 is inserted. When the spacing between the side boards 1 is set using the bolt 15 and slot 13 according to the width of the panel plates to be housed, a nut is used to fix the connecting plates 3 and 4. The attachment of the connecting plates 3 and 4 is similarly implemented with respect to the bases 2 provided at the lower end of the side frame boards.

Figure 4:
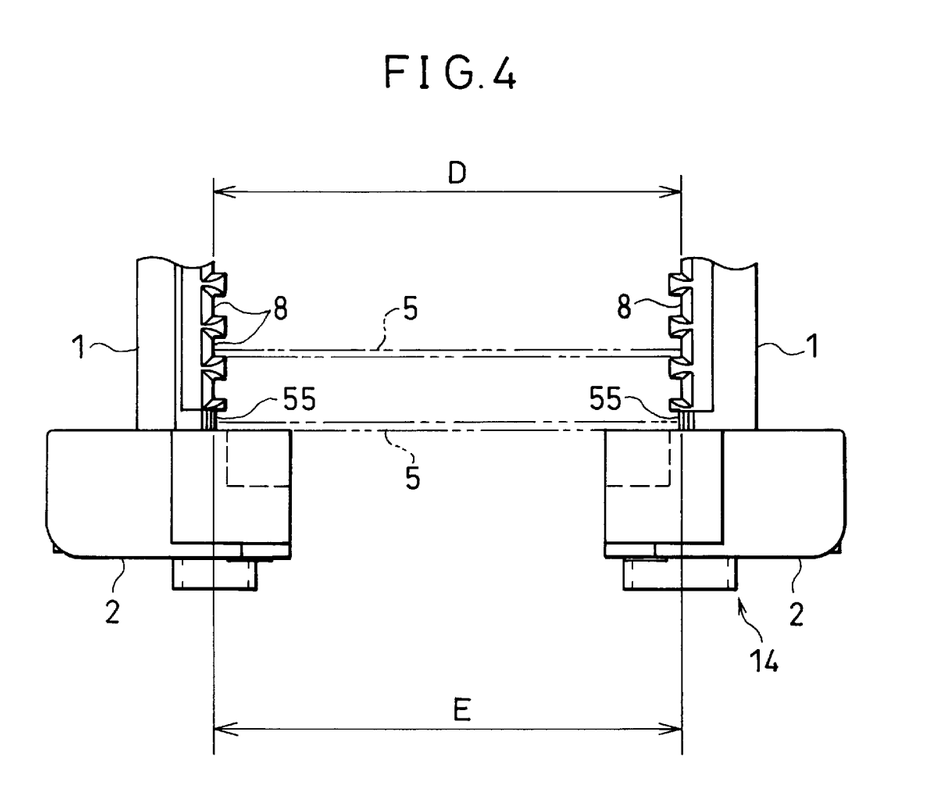
FIG. 4 is an explanatory view illustrating a means of setting the housing width of the frame structure according to the present invention.
Figure 5:
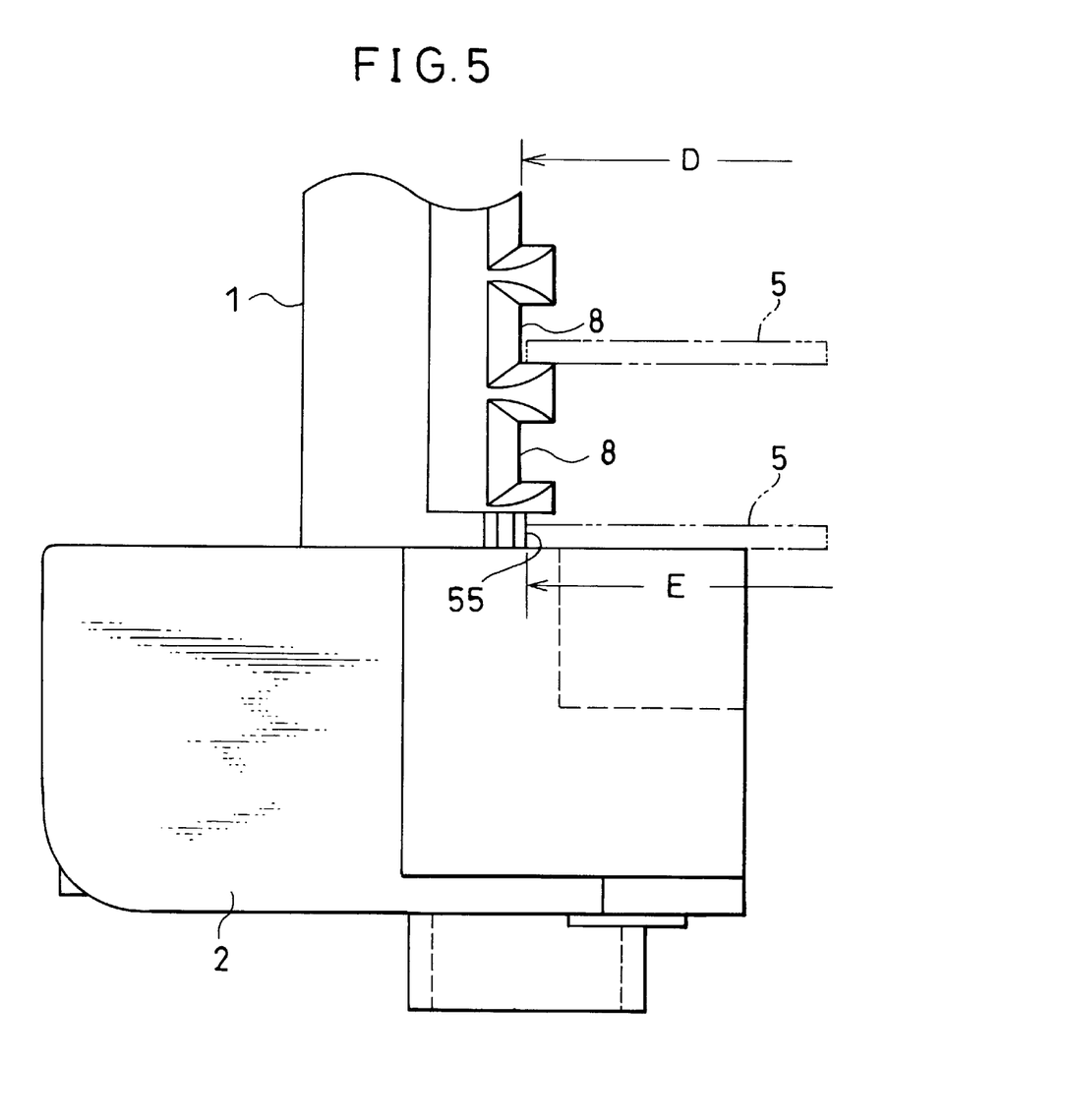
FIG. 5 is an enlarged view of the essential part of the width setting means of FIG. 4.

FIG. 4 illustrates how the spacing between the side frame boards 1 is set according to the panel plates 5 to be housed. To facilitate understanding, the stop members are not shown. FIG. 5 is an enlarged view of the essential part of FIG. 4. In the drawing, E denotes the width of a housed panel plate 5, and D denotes the width to be set, which is around 1 mm wider than width E. In order to set the distance between the facing support grooves 8 of the pair of side frame boards 1 to D, the side boards are each provided with a spacing adjustment projection 55 to form the predetermined clearance between the inner surfaces of the side frame boards that face each other. A panel plate to be housed is positioned in contact with the projections 55, one of the side frame boards 1 is fixed and the other side frame board is moved into contact towards the first side frame board and the connecting plates 3 and 4 are secured. Employing this means of setting the housing width for the panel plates makes it possible to readily set the spacing between the grooves of the side boards to the width D that includes a suitable clearance for readily inserting and removing panel plates. Although the projection 55 has been described as being provided on both of the side frame boards 1, the size of the projection 55 can be doubled and the projection used on just one side.

As shown in FIG. 5, the projection 55 is provided on the lower part of the bottom support groove 8. However, this is not limitative, and the projection 55 can be provided on grooves located at the upper and lower ends, with a panel plate first inserted at the upper end being used to adjust the spacing between the side frame boards 1, followed by the housing of a panel plate at the lower end to adjust the spacing there. Housing the panel plates in said grooves at the upper and lower ends, urging the movable side frame board toward the immovable side frame board and securing it at the contact position enables the adjustment of the spacing between the side boards to be efficiently accomplished in one operation. The projection 55 can be secured in position in the groove by adhesive, and removed after the spacing has been adjusted, allowing the groove to be used as a normal support groove. While FIG. 5 only shows the projection 55 used at the lower end, providing projections 55 in the top and bottom support grooves 8 enables the spacing between the pair of side frame boards to be efficiently adjusted in one operation.

The stop members 6 shown in FIG. 3 are used to keep the housed panel plates from coming out of the frame structure. For this, the stop members 6 are supported by the hinge members 16, which have a cam surface. The configuration takes up little space and enables the frame structure to be readily locked and unlocked.

Figure 6:
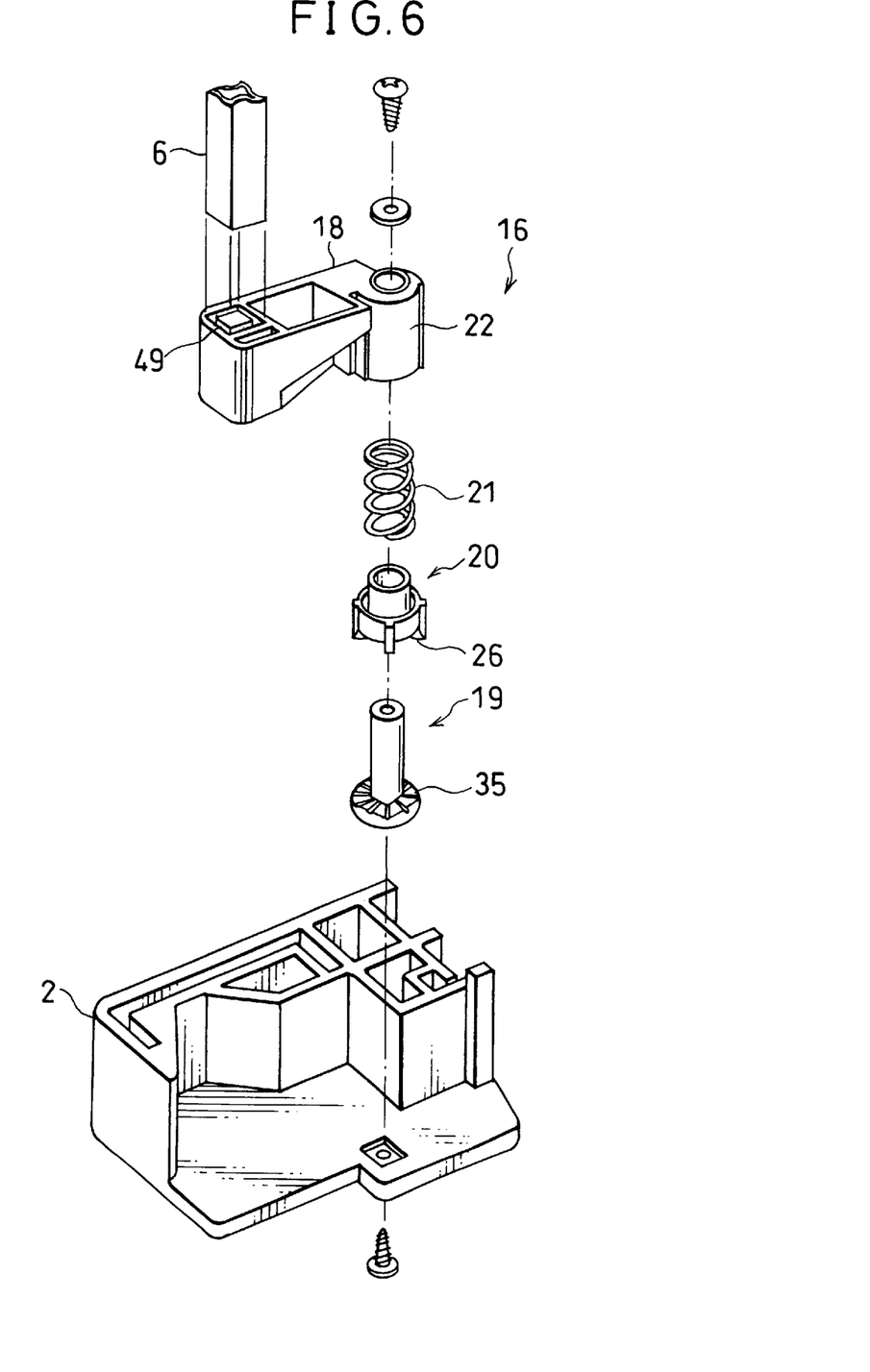
FIG. 6 is an exploded perspective view showing a hinge member used to support a stop member.

FIG. 6 shows a disassembled view of the hinge member 16. The hinge member 16 includes a recess 49 at the front end that accommodates the stop member 6; an arm 18 at the back end having a cylindrical portion 22 that houses a cam, described later; a first cam 19 attached to the base 2; a second cam 20 that is in pressure contact with the first cam 19 and rotates together with the arm 18; and a compression spring 21 housed in the cylindrical portion 22 that urges the second cam 20 towards the first cam 19.

The first and second cams 19 and 20 are provided with cam face portions 35 and 26, respectively. The cams are urged together by the force of the cam face slope and spring 21. The cam faces are formed so that by rotating the stop members 6 by specific amounts, the state of contact between the cams is changed, moving the stop members 6 to the open or closed position.

Figure 9:
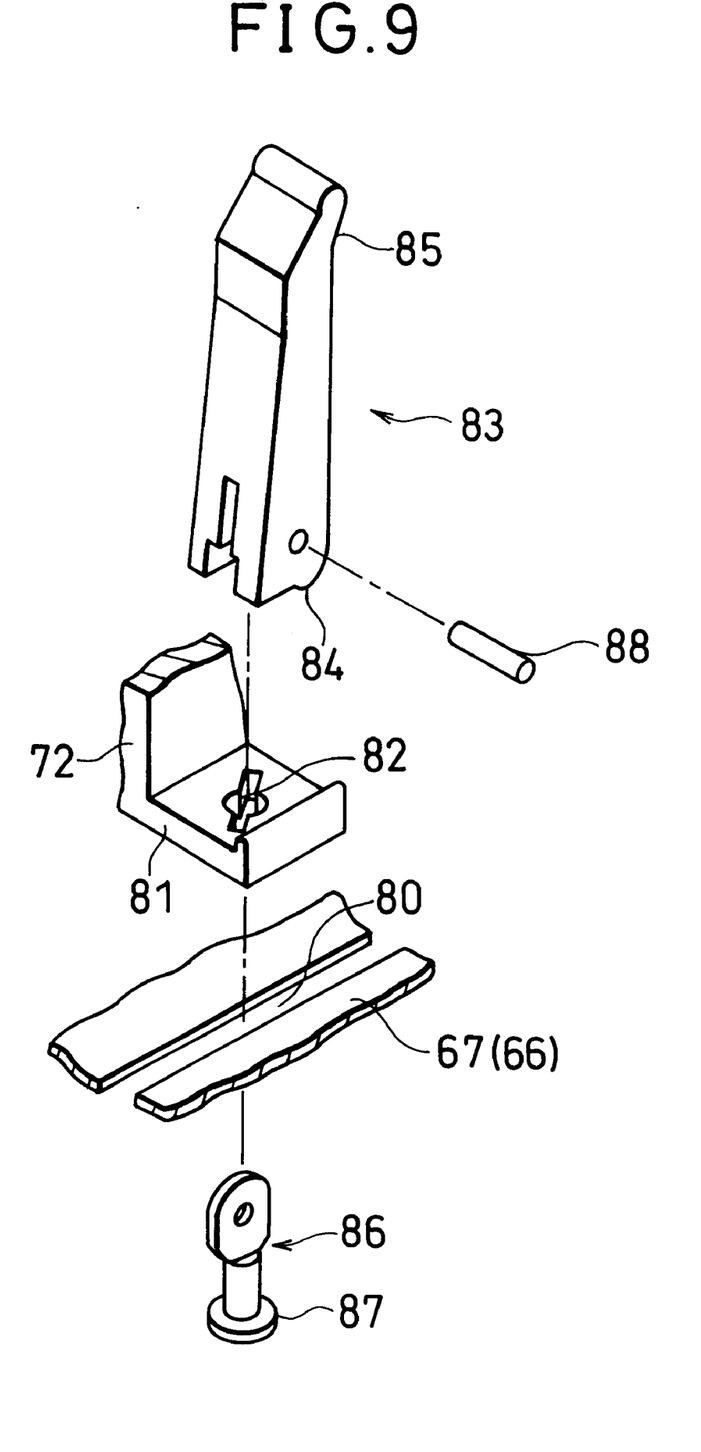
FIG. 9 is an exploded perspective view showing an embodiment of a means for securing the movable side frame board.
Figure 10:
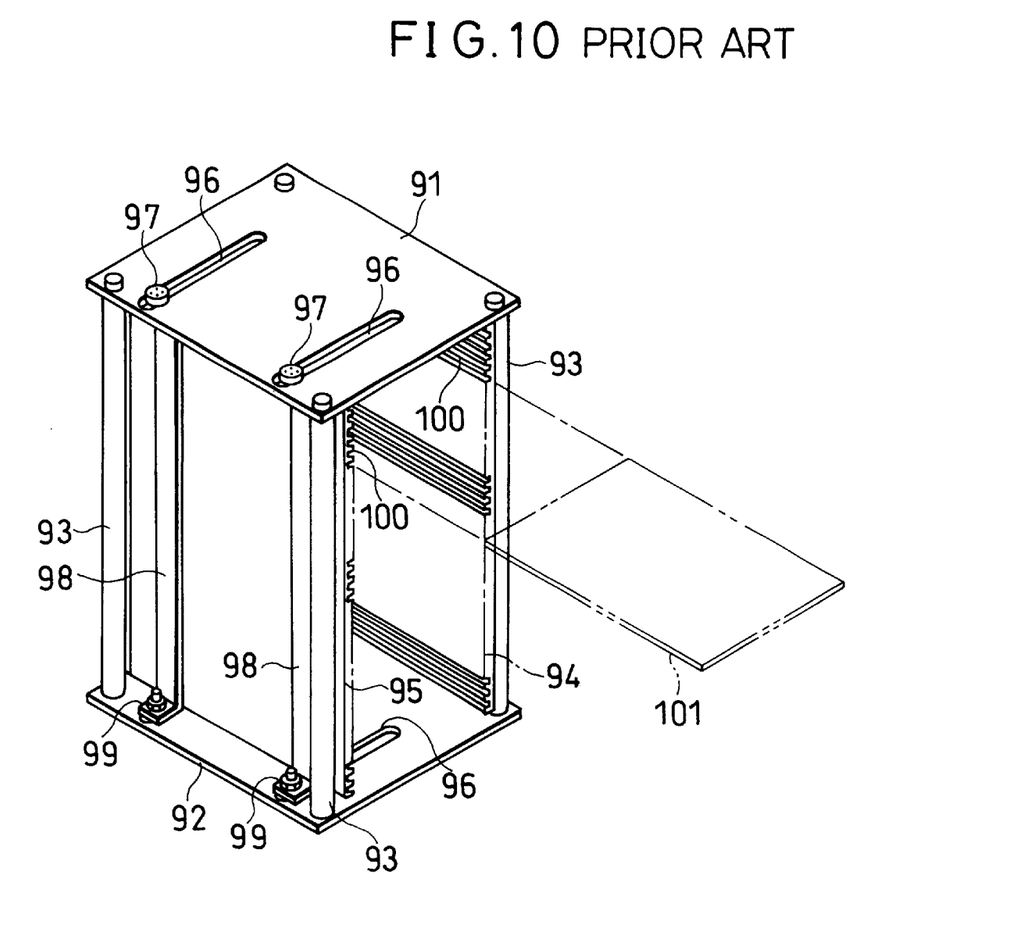
FIG. 10 is a perspective view showing a prior art frame structure.

The arrangement for setting the spacing to D is applicable not only to the frame structure of the above embodiment, but can also be applied to a prior art type of frame structure configuration, such as that shown in FIG. 10, which uses a combination of slots and screw fasteners. The arrangement can also be applied to frame structures that use a rack and pinion or a chain arrangement or the like to effect parallel movement of one side frame board towards the other. A second embodiment of the frame structure according to the present invention that uses a rack and pinion arrangement will now be described with reference to FIGS. 7, 8 and 9.

Figure 7:
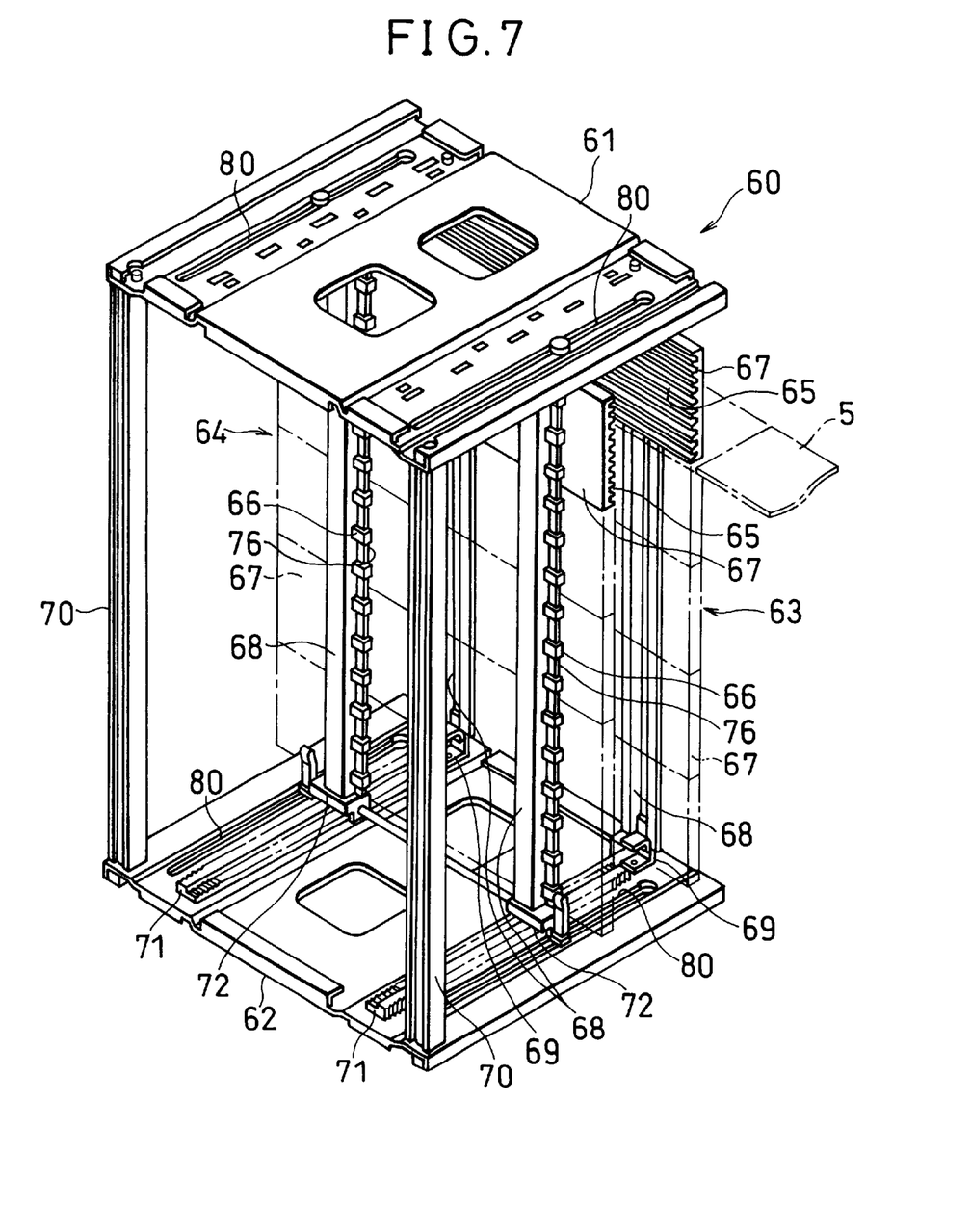
FIG. 7 is a perspective view showing a frame structure according to another embodiment of the present invention.

FIG. 7 is a perspective view of a frame structure 60 that has a top plate 61 and a bottom plate 62, each of which is made of galvanized sheet steel or the like that is pressed into a configuration to provide appropriate rigidity. The frame structure also has an immovable side frame board 63 and a movable side frame board 64 which have a plurality of support grooves 65 formed on their inner surface. The side frame boards are composed of a plurality of small unit plates 67. Each of the unit plates 67 has a plurality of hooks 66 on its outer surface that are positioned to face each other slightly in from each longitudinal edge. A plurality of the unit plates 67 are stacked one on top of another within the same plane and the web 76 of a hat member 68 is inserted into the space defined by a row of the hooks 66, forming a unitary structure. The immovable side frame board 63 is secured to both the top plate 61 and bottom plate 62 at either the right or left side by means of angle members 69 attached to both the upper and lower ends of the hat members 68. Support columns 70 are erected at the two corners of the other side of the frame structure 60 so as to support and fix the top plate 61 and bottom plate 62 at a set distance. In other words, the top plate 61, the bottom plate 62, the hat members 68 on the immovable side frame board 63, the angle members 69 and support columns 70 combine to form a box-shaped structure that has sufficient rigidity to be usable as a frame structure. A pair of guide rails 71 are provided on the inner surfaces of top plate 61 and bottom plate 62 at right angles with respect to the immovable side frame board 63 such that the movable side frame board 64 can be moved toward or away from the immovable side frame board 63, with the two side frame boards remaining parallel to each other. Each of the guide rails 71 has a rack 78 formed along the entire length of a horizontal surface of the rail and a rack 79 formed along the entire length of a perpendicular surface of the rail. Each of the top and bottom plates is provided with slots 80 formed parallel to the guide rails 71. Although in this embodiment the top and bottom plates 61 and 62 are formed of sheet metal, they can also be formed using synthetic resin. If the plates are formed of resin, the guide rails 71, top plate and bottom plate can be formed as an integrated unit.

Figure 8:
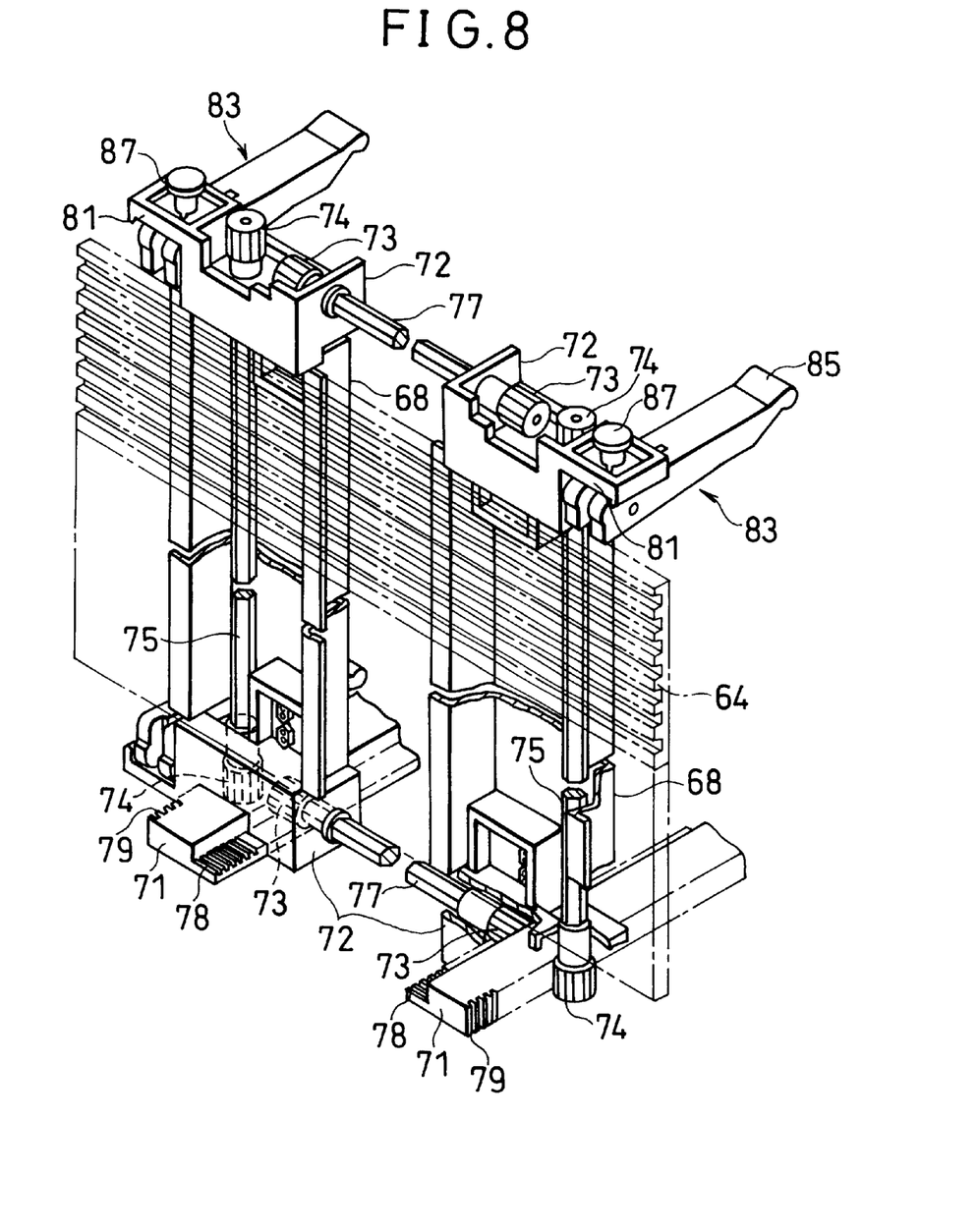
FIG. 8 is an enlarged perspective view of the essential part of the frame structure of FIG. 7.

With reference to FIG. 8, sliders 72 are secured to the top and bottom of the hat members 68 of the movable side frame board 64. These sliders 72 ride over the guide rails 71. (The top and bottom plates are not shown in FIG. 8.) Two pinions 73 and 74 are rotatably mounted in each of the sliders 72 in such a manner that their axes cross each other at right angles. The pinion 73 meshes with the horizontal rack 78 on the guide rail 71, and the pinion 74 meshes with the perpendicular rack 79.

The pinions 73 mounted in each pair of adjacent sliders 72 are interconnected by a single rotational shaft 77. The pinions 74 provided in the interior of the pair of vertically disposed sliders 72 are maintained by a single rotation shaft 75. Thus, it will be seen from the above that pinions 73 and 74 combine with sliders 72 at the four corners of the movable side frame board 64. The corresponding guide rails 71 and racks 78 and 79 are provided on the inside surface of the top and bottom plates 61 and 62. The effect of the combination of the guide rails 71 and sliders 72 with the racks 78, 79 and pinions 73, 74 is to enable smooth, parallel movement of the movable side frame board 64.

FIG. 9 is an exploded perspective view showing an embodiment of a means for securing the movable side frame board. Each of the sliders 72 has a fastening lug 81 that projects out to come in contact with the top plate 61 and bottom plate 62. The lug 81 has a mounting hole 82 that is formed at a position corresponding to the slot 80 that is parallel to the guide rails 72. The means of securing the movable side frame board 64 comprises a lock lever 83 having a cam surface 84 at one end and a lever action arm 85 at the other end, and a tension rod 86 that at one end is provided with a flange that locates on the rear side of the slot 80, while the other end is inserted into the hole 82 and a pin 88 is used to connect a tension rod 86 with the lock lever 83.

When the lever 83 is pushed upright, the cam surface 84 lifts the tension rod 86, clamping the slot 80 between the lug 81 and the flange 87, locking the movable side frame board 64 to the top plate 61 and bottom plate 62. When the lever 83 is brought down to the horizontal position, an unlocked state is created that allows the movable side frame board 64 to be moved. Because this configuration enables the movable side frame board 64 to be moved smoothly while maintaining its parallel state, only one spacing adjustment projection needs to be used. Projections are provided for adjusting the spacing between the side frame boards, so that by simply housing a panel plate and securing the movable side board, the distance between the housing support grooves, including the necessary clearance, is set.

The means for moving one side board in parallel towards the other side board enables a distance having a predetermined clearance to be set rapidly by a single operation with ease.

What is claimed is:

1. A frame structure comprising:

a pair of side frame boards facing each other, each side frame board of said pair of side frame boards having an inner surface provided with a plurality of support grooves, said plurality of support grooves for receiving and supporting panel plates;

adjusting means for adjusting a spacing between said pair of side frame boards; and an adjustment projection on at least one of said inner surfaces of said pair of side frame boards, said adjustment projection having a surface contacting at least one side surface of one of the panel plates prior to the panel plates being received in said plurality of grooves in order to set a distance between end surfaces of opposed ones of said plurality of support grooves equal to a width of each of the panel plates received in and supported by said plurality of support grooves and a predetermined clearance.

2. The frame structure according to claim 1, further comprising parallel movement effecting means for effecting parallel movement of a first side frame board of said pair of side frame boards towards a second side frame board of said pair of side frame boards.

3. A frame structure comprising:

a pair of side frame boards facing each other, each side frame board of said pair of side frame boards having an inner surface provided with a plurality of support grooves, said plurality of support grooves for receiving and supporting panel plates;

an adjustment device configured to adjust a spacing between said pair of side frame boards; and an adjustment projection on at least one of said inner surfaces of said pair of side frame boards, said adjustment projection having a surface contacting at least one side surface of one of the panel plates prior to the panel plates being received in said plurality of grooves in order to set a distance between end surfaces of opposed ones of said plurality of support grooves equal to a width of each of the panel plates received in and supported by said plurality of support grooves and a predetermined clearance.

4. The frame structure according to claim 1, further comprising a parallel movement effecting device configured to effect parallel movement of a first side frame board of said pair of side frame boards towards a second side frame board of said pair of side frame boards.

* * * * *